(12) United States Patent
Koyama et al.

(10) Patent No.: US 6,350,365 B1
(45) Date of Patent: Feb. 26, 2002

(54) METHOD OF PRODUCING MULTILAYER CIRCUIT BOARD

(75) Inventors: Toshinori Koyama; Noritaka Katagiri, both of Nagano (JP)

(73) Assignee: Shinko Electric Industries Co., LTD, Nagano (JP)

( * ) Notice: Subject to any disclaimer, the term of this patent is extended or adjusted under 35 U.S.C. 154(b) by 0 days.

(21) Appl. No.: 09/634,783

(22) Filed: Aug. 9, 2000

(30) Foreign Application Priority Data

Aug. 12, 1999 (JP) .......................................... 11-228406

(51) Int. Cl.$^7$ ................................................. C25D 5/02

(52) U.S. Cl. ........................ 205/125; 205/162; 205/163; 205/165; 205/167; 205/169

(58) Field of Search ................................ 205/125, 162, 205/163, 165, 167, 169

(56) References Cited

U.S. PATENT DOCUMENTS 5,976,341 A * 11/1999 Schumacher et al. ....... 205/125

* cited by examiner

Primary Examiner—Arun S. Phasge
(74) Attorney, Agent, or Firm—Paul & Paul (57) ABSTRACT

A method of producing a multilayer circuit board comprising a core substrate and a plurality of layers of wiring lines on both sides of the core substrate with an insulation layer being interposed therebetween; the layers of wiring lines on both sides being interconnected by conducting members provided on the inside walls of through holes going through the core substrate, and the interposed insulation layer. The method further comprising, wiring lines with an upper layer of wiring lines wherein the conducting member on the inside wall of the through hole and the via are formed in separate steps. The method can provide a multilayer circuit board which can advantageously be used to mount a chip or device thereon having an increased number of electrodes or terminals.

14 Claims, 6 Drawing Sheets

METHOD OF PRODUCING MULTILAYER CIRCUIT BOARD

BACKGROUND OF THE INVENTION

1. Field of the Invention

The invention relates to a method of producing a multilayer circuit board in which a plurality of wiring layers (routing layers) are formed on a core substrate by a build-up process.

2. Description of the Related Art

Figure 6:
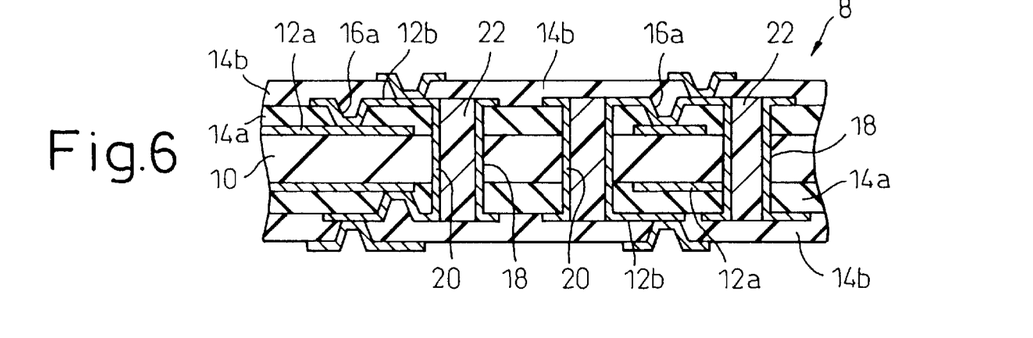
FIG. 6 shows a typical structure of a multilayer circuit board.

A multilayer circuit board typically comprises a core substrate and a plurality of wiring layers built up on both sides of the core substrate, with an insulation layer being interposed therebetween. FIG. 6 illustrates such a multilayer circuit board 8 comprising a core substrate 10, wiring layers each comprising patterned wiring lines (routing lines) 12a, 12b provided on both sides of the core substrate 10, and insulation layers 14a, 14b. The wiring lines 12a and 12b on each of the sides of the core substrate 10 are electrically connected with each other by a via 16a provided in the insulation layer 14a, the via usually having a diameter of about 80 micrometers and a depth of about 40 to 50 micrometers. The wiring lines 12a, 12b on one side of the core substrate 10 are connected with the wiring lines 12a, 12b on the other side of the core substrate 10 by a conducting member 20 formed on the inside wall of a through hole 18 which pierces through the core substrate 10, the through hole usually having a diameter of about 200 to 300 micrometers. The inside of the conducting member 20 on the inside wall of the through hole 18 is filled with an insulation material 22 such as a resin.

Figure 7A:
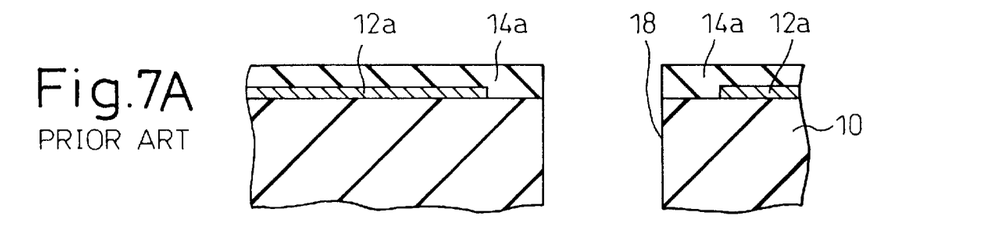
FIGS. 7A to 7C illustrates the production of a multilayer circuit board by a conventional process.
Figure 7B:
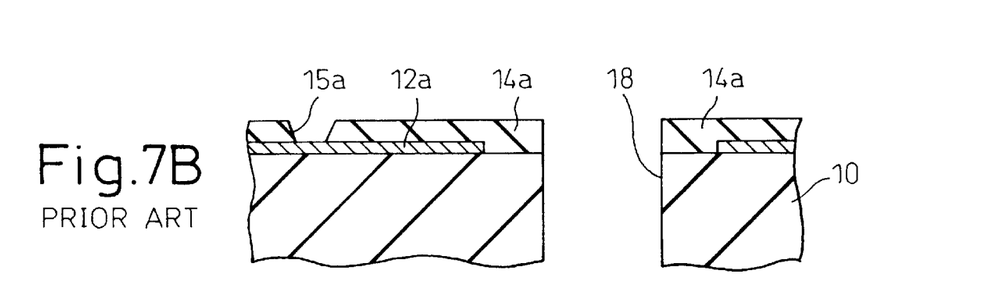
Figure 7C:
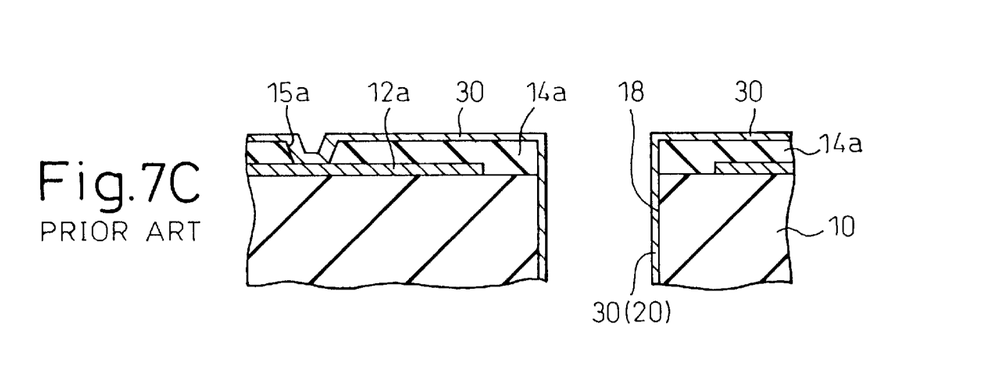

A build-up process for the manufacture of the multilayer circuit board 8 depicted in FIG. 6 is illustrated in FIGS. 7A to 7C. In the process of FIGS. 7A to 7C, first patterned wiring lines 12a are formed on both sides of the core substrate 10, as shown in FIG. 7A which illustrates only one side of the substrate 10 for simplicity. The wiring lines 12a are then covered with an electrical insulation layer 14a, and through holes 18 are formed to pierce through the insulation layers 14a on both sides of the core substrate 10 and the core substrate 10 itself. Subsequently, as illustrated in FIG. 7B, via holes 15a are formed in the insulation layer 14a for subsequent formation of vias. The substrate 10 provided with the insulation layer having via holes 15a is then subjected to electroless plating and electroplating, to thereby form a continuous conductor layer 30 to cover the insides of the via hole 15a and the through hole 18, and the insulation layer 14a, as illustrated in FIG. 7C. Portions of the continuous conductor layer 30 in the insides of the through holes 18 are subsequently formed into the conducting member 20 (FIG. 6), and portions of the continuous conductor layer 30 on the top surface of the insulation layer 14a and in the inside of the via holes 15a are formed into the second patterned wiring lines 12b (FIG. 6) and the vias 16a (FIG. 6), respectively, by etching the continuous conductor layer 30.

In the manufacture of a multilayer circuit board using a build-up process as described above, the continuous conductor layer 30 is formed simultaneously on the insides of the through holes 18 and the via holes 15a by plating. In such a case, where plating is carried out under circumstances where through holes 18 and via holes 15a coexist, a plated layer in the inside of the through hole 18 has a smaller thickness relative to a thickness of a plated layer in the inside of the via hole 15a, in general. This is because the deposition of plating material from a plating bath to a surface to be plated varies between the through hole 18 having no bottom and the via hole 15a having a bottom, depending on plating conditions such as the composition of the plating bath used.

In a typical multilayer circuit board produced by a conventional build-up process, the via 16a (FIG. 6), which is made up of the portion of conductor layer deposited on the inside wall and the bottom of the via hole 15a in FIG. 7C, electrically connects wiring lines 12a and 12b of the adjacent layers with each other, and the via hole 15a is not filled with the plated conductor material. For a multilayer circuit board of a high mounting density, it is useful that it has vias filled with a conductor material, which are called "filled vias" and can be arranged with a high density.

To fill the via holes 15a by plating, a plating solution which contains an additive that does not accelerate a rate of plating on the insulation layer 14a to thereby form thereon a conductor layer of a smaller thickness but accelerates a rate of plating in the via holes 15a, is used. When a plating solution contains such a suitable additive for the formation of filled vias, however, the conductor layer formed on the inside wall of the through hole 18 also has a smaller thickness like the conductor layer formed on the insulation layer 14a.

SUMMARY OF THE INVENTION

An object of the invention is to provide a method of producing a multilayer circuit board having a plurality of layers of wiring lines on both sides of a core substrate, which makes it possible to fill via holes with a conductor material to provide filled vias capable of being arranged in a high density, and also form a reliable conducting member in the through holes, by plating under circumstances that the via holes and the through holes coexist.

According to the invention, a multilayer circuit board which comprises a core substrate and a plurality of layers of wiring lines on both sides of the core substrate, the layers of wiring lines being on each side of the substrate with an insulation layer being interposed therebetween, the layers of wiring lines on both sides being interconnected by conducting members provided on the inside walls of through holes going through the core substrate, and the layers of wiring lines on each side of the core substrate being connected with each other by vias of a conductor material going through the interposed insulation layer, is produced by a method comprising, on each of sides of the core substrate, alternately forming a layer of wiring lines and an insulation layer while connecting a lower layer of wiring lines with an upper layer of wiring lines by vias, wherein the conducting member on the inside wall of the through hole and the via are formed in separate steps.

In an embodiment of the invention, the method comprises the following steps: providing a core substrate having a patterned first layer of wiring lines formed on each side thereof, forming an insulation layer on each side of the core substrate to cover the entire area of the substrate provided with the first layer of wiring lines, forming through holes extending from one side to the other side of the core substrate piercing through the insulation layer on both sides of the core substrate and the core substrate itself, forming via holes in the insulation layer on each side of the core substrate to expose parts of the layer of wiring lines at the bottom, forming a continuous conductor layer to cover the inside walls of the through holes, the insulation layer, and the exposed parts of the layer of wiring lines, filling the through holes with an insulation material such as a resin, filling the via holes with a conductor material, forming a conductor layer on the continuous conductor layer covering the insulation layer to provide a lamination of two conductor layers, simultaneously with or separately from the step of filling the via holes, and patterning the lamination of two conductor layers to thereby provide a second layer of wiring lines.

In another embodiment of the invention, the method comprises the following steps: providing a core substrate, forming through holes in the core substrate, forming a continuous conductor layer on each side of the substrate and the inside walls of the through holes, filling the through holes with an insulation material such as a resin, patterning the continuous conductor layer to form a first layer of wiring lines, forming an insulation layer on each side of the core substrate to cover the entire area of the substrate provided with the first layer of wiring lines, forming via holes in the insulation layer on each side of the core substrate to expose parts of the first layer of wiring lines at the bottom, filling the via holes with a conductor material, forming a conductor layer on the insulation layer, simultaneously with or separately from the step of filling the via holes, and patterning the conductor layer to thereby provide a second layer of wiring lines.

In this embodiment, the first layer of wiring lines may be formed by forming an additional conductor layer on the continuous conductor layer to provide a lamination of two conductor layers on the insulation layer, and then patterning the lamination of two conductor layers.

In a further embodiment of the invention, the method comprises the following steps: providing a core substrate having a patterned first layer of wiring lines formed on each side thereof, forming an insulation layer on each side of the core substrate to cover the entire area of the substrate provided with the first layer of wiring lines, forming through holes extending from one side to the other side of the core substrate piercing through the insulation layer on both sides of the core substrate and the core substrate itself, forming a continuous conductor layer to cover the inside walls of the through holes and the insulation layer, filling the through holes with an insulation material such as a resin, patterning the continuous conductor layer to provide a second layer of wiring lines, forming an additional insulation layer to cover the formerly formed insulation layer provided thereon with the second layer of wiring lines, forming via holes piercing through the two insulation layers to expose parts of the first layer of wiring lines at the bottom, filling the via holes with a conductor material, forming a conductor layer on the top of the two insulation layers, simultaneously with or separately from the step of filling the via holes, and patterning the conductor layer to thereby provide a second layer of wiring lines.

In this embodiment, the second layer of wiring lines may be formed by forming an additional conductor layer to cover the continuous conductor layer and the ends of the insulation material filled in the through holes to provide a lamination of two conductor layers, and then patterning the lamination of two conductor layers.

BRIEF DESCRIPTION OF THE DRAWINGS

The above and other objects and advantages of the invention will be well understood and appreciated by a person with ordinary skill in the art, after considering the following detailed description made by referring to the attached drawings, wherein.

DETAILED DESCRIPTION OF THE INVENTION

Figure 1A:
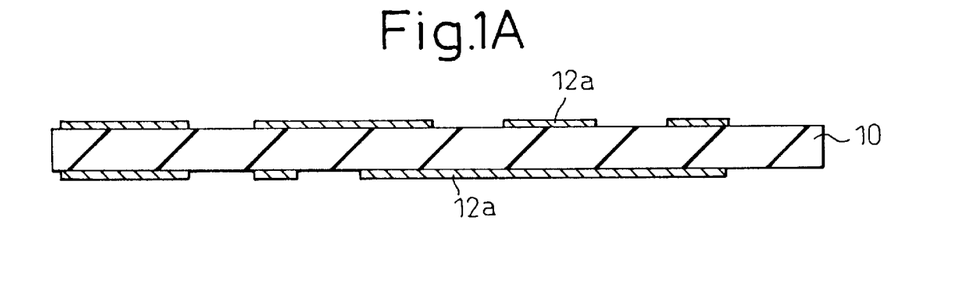
FIGS. 1A to 1I illustrate a series of steps in an embodiment of the invention.

To produce a multilayer circuit board, a core substrate having a conductor layer, such as of a copper foil, provided on each side thereof is used in most cases, and the conductor layers are patterned by a conventional process, such as etching, to form a first layer of wiring lines 12a on both sides of the core substrate 10, as illustrated in FIG. 1A. Typically, the core substrate 10 is formed of an epoxy-impregnated fabric of glass or a bismaleimide triazine (BT) resin, for example.

Figure 1B:
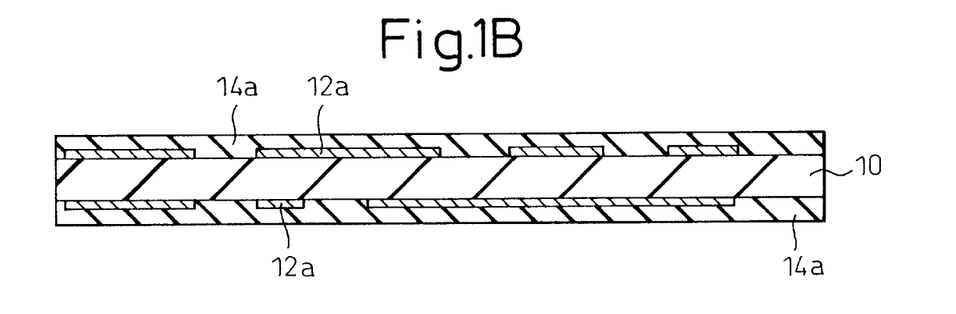

The core substrate 10 having patterned wiring lines 12a is then covered on each side with an electrical insulation layer (a first insulation layer) 14a by sticking thereon an insulation film of, for example, polyimide, epoxy, or polyphenylene ether, as illustrated in FIG. 1B. The insulation layer 14a may be formed by coating the substrate 10 with a resin material having electrical insulation properties in place of sticking the insulation film.

Figure 1C:
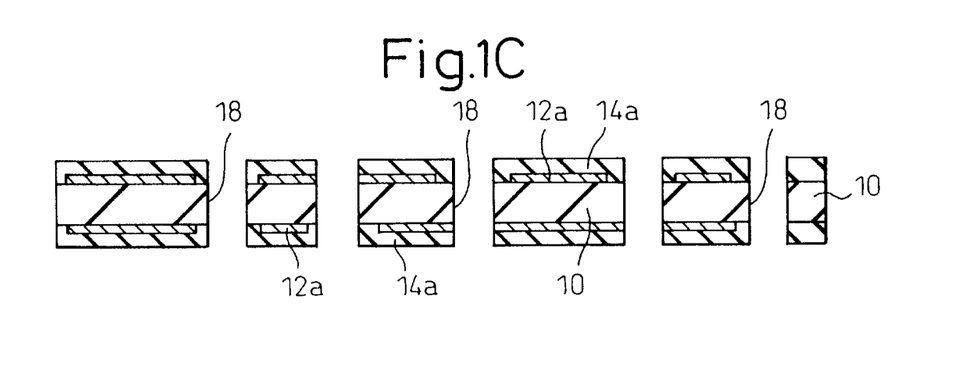

Subsequently, through holes 18 are formed through the insulation layers 14a on both sides of the core substrate 10 and the core substrate 10 itself in the direction of its thickness, as illustrated in FIG. 1C. As shown in the drawing, some through holes may go through the layer of wiring lines 12a on one or both sides of the core substrate 10. The through holes 18 are typically formed by mechanical drilling.

Figure 1D:
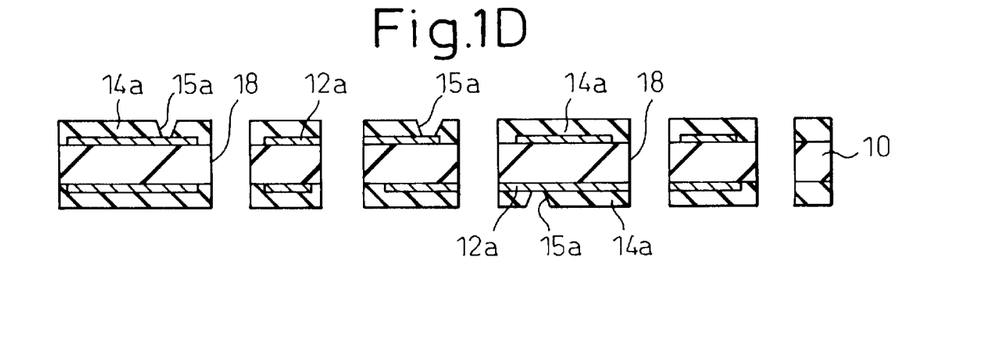

Via holes 15a are then formed in the insulation layers 14a for subsequent formation of vias electrically connecting the first layer of wiring lines 12a with a second layer of wiring lines to be subsequently formed, as shown in FIG. 1D. The via holes 15a are formed by irradiating the insulation layers 14a with laser beam in a certain pattern to form a hole in the insulation layer 14a and expose at the bottom of the hole part of the wiring line 12a. Alternatively, the via holes 15a may be formed by use of a lithography process which chemically etches the insulation layers 14a. The via holes 15a may be formed prior to the formation of the through holes 18.

Figure 1E:
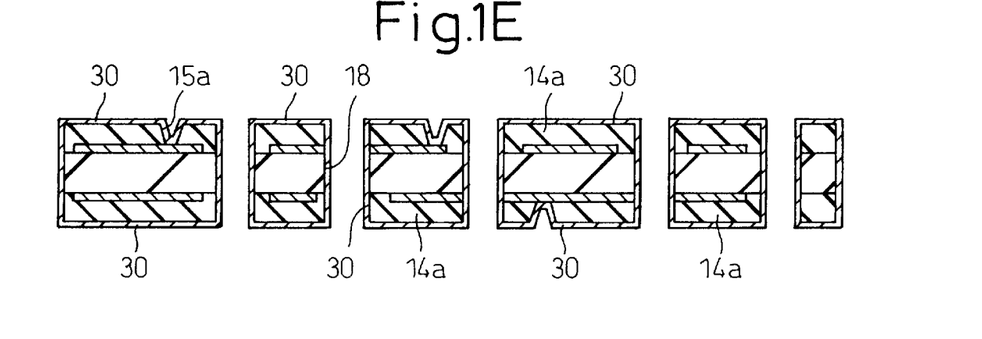

Subsequently, electroless plating and electroplating of copper are successively carried out to thereby form a continuous conductor layer 30 which covers the surface of the insulation layer 14a, the inside wall and the bottom of the via hole 15a, and the inside wall of the through hole 18, as illustrated in FIG. 1E. It is well known that electroless plating can initially form an electric power supply layer for subsequent electroplating, and electroplating can then build up a plated conductor layer up to an objective thickness. The plating step herein chiefly aims at providing the inside wall of the through hole 18 with a layer of conductor, such as copper, having a predetermined thickness. In general, a conductor layer on the inside wall of a through hole has a thickness of the order of 20 micrometers. Thus, the plating step herein is carried out using a plating solution and conditions ensuring that a plated layer has a predetermined thickness of the order referred to above on the inside wall of the through hole 18.

Figure 1F:
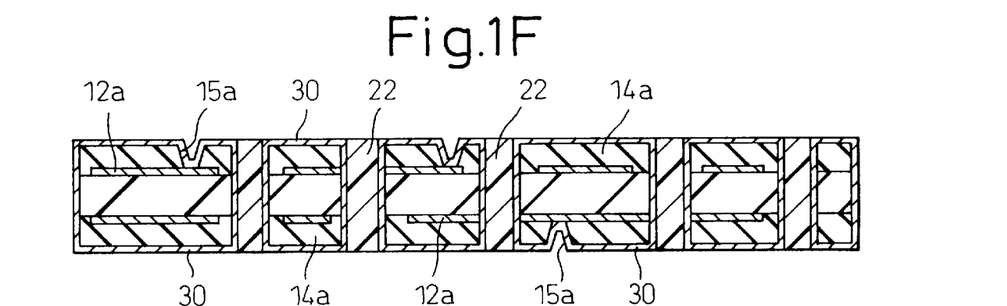

The through holes thus provided on their inside walls with the conductor layer are then filled with a resin material 22 to be plugged up, as shown in FIG. 1F. This makes it possible to subsequently form a further layer or layers of wiring lines on both sides of the core substrates 10 having the first layer of wiring lines 12a, to thereby provide a multilayer circuit board having a certain number of layers of wiring lines.

Figure 1G:
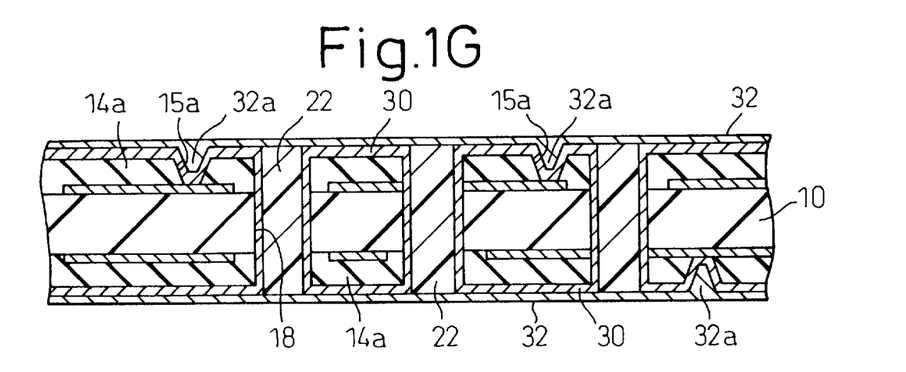

In a subsequent cover-plating step illustrated in FIG. 1G, plating is carried out to completely fill the via holes 15a with a plated conductor material (copper in this example). The cover-plating step aims at filling the via holes 15a with the plated material and, accordingly, this step is carried out using a plating solution and conditions ensuring that the via holes 15a are completely filled with the plated material. Typically, as a plating solution, Cu-Brite VF obtained from Ebara Udylite Co., Ltd. of Japan can be used at a current density of about 2 ASD.

In FIG. 1G, the plated material filled in the via holes 15a is indicated by reference numeral 32a. During the plating, a plated film 32 is also formed to cover the conductor layer 30 previously formed and the exposed ends of the resin material 22 filled in the through holes 18. To form the film 32 on the exposed ends of the resin material 22 in the through holes 18, electroless plating and electroplating are also successively carried out in the cover-plating step. In some cases, the conductor layer 30 may be formed separately from the filling of the via holes 15a, typically using plating solution and conditions different from those for the filling of the vias 15a subsequently thereto.

Figure 1H:
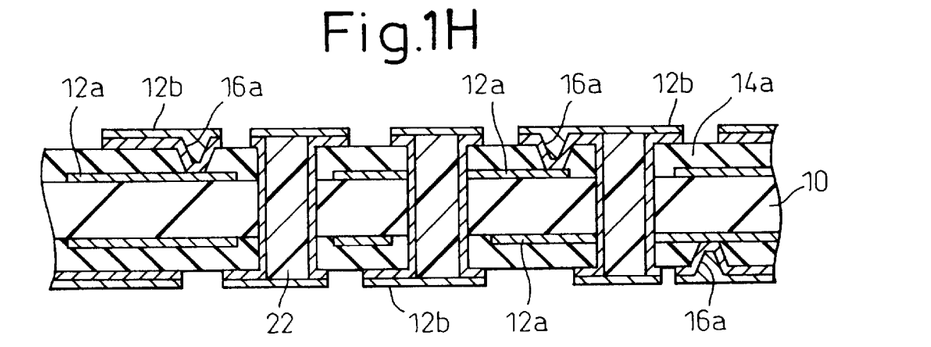

The plated film 32 and the underlying conductor layer 30 are then patterned by etching to provide a second layer of wiring lines 12b, as illustrated in FIG. 1H. Specifically, the wiring lines 12b can be formed by, for example, applying a photosensitive resist (not shown) on the plated film 32 to form a resist film, exposing and developing the resist film to form a resist pattern (not shown), etching the plated film 32 and the underlying conductor layer 30 (FIG. 1G) using the resist pattern as a mask, and removing the resist pattern.

As illustrated in FIG. 1H, the wiring line 12a of the first wiring layer is thus connected with the wiring line 12b of the second layer through the filled via 16a formed of the conductor plated on the inside wall and bottom of the via hole 15a and the conductor subsequently filled in the via hole 15a.

Figure 1I:
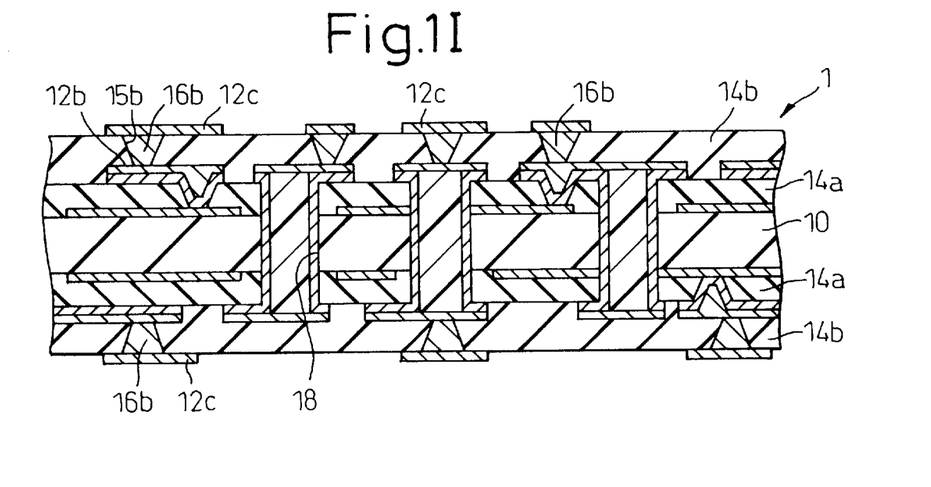

Subsequently, a second insulation layer 14b and a third layer of wiring lines 12c are formed as illustrated in FIG. 1I. They can be formed in the same manner as described for the formation of the first insulation layer 14a and the second layer of wiring lines 12b, except that the third layer of wiring lines 12c and vias 16b connecting the second layer of wiring lines 12b with the third layer of wiring lines 12c may be formed in one step, i.e., without forming two continuous conductor layers as in the formation of the vias 16a and the second layer of wiring lines 12b.

When the third layer of wiring lines 12c is formed, through holes are not formed but via holes 15b (FIG. 1I) only are formed. Consequently, a plating solution and plating conditions may be selected so as to fill the via holes 15b with a plated material. To form a continuous conductor layer, which is patterned later, on the second insulation layer 14b, an electroless-plated layer (not shown) having a small thickness is first formed on the second insulation layer 14b, and an electroplated layer is then formed to provide a continuous plated layer having a predetermined thickness using the electroless-plated layer as a power supply layer, as earlier described. Although the power supply layers for subsequent electroplating are formed by electroless plating in the embodiment described herein, they may be formed by a sputtering process.

To fill the via holes 15b in the second insulation layer 14b by plating to provide "filled vias" 16b, it is required to select an appropriate sizes of the via hole 15b and appropriate plating conditions. For example, it is required that the via hole 15b has an aspect ratio h/r of a range of approximately 0.5 to 1.5, wherein h denotes a depth of the via hole and r denotes an opening diameter of the via hole, and electroplating of copper is carried out using a current density of 0.1 to 2 ASD, which is somewhat smaller than a current density ordinarily used for electroplating of copper (2 to 3 ASD).

The continuous conductor layer is formed on the second insulation layer 14b by the electroplating while filling the via holes with the plated material, and can then be etched to form the third layer of patterned wiring lines 12c on the insulation layer 14b. The continuous conductor layer on the second insulation layer 14b may be formed separately from the filling of the via holes 15b, as earlier described.

As shown in FIG. 1I, in the multilayer circuit board 1 having filled vias 16a, 16b as formed in the above, the via 16b in the second insulation layer 14b can easily be located just above the through hole 18 or the via 16a in the first insulation layer 14a, which makes it possible to arrange the vias, particularly the vias 16b in the second insulation layer 14b, in a high density. Thus, in a layer in which through holes and vias do not coexist, as in the second insulation layer 14b of FIG. 1I, vias can easily be arranged in a high density by the use of filled vias.

Now, further embodiments of the method of the invention will be described.

Figure 2:
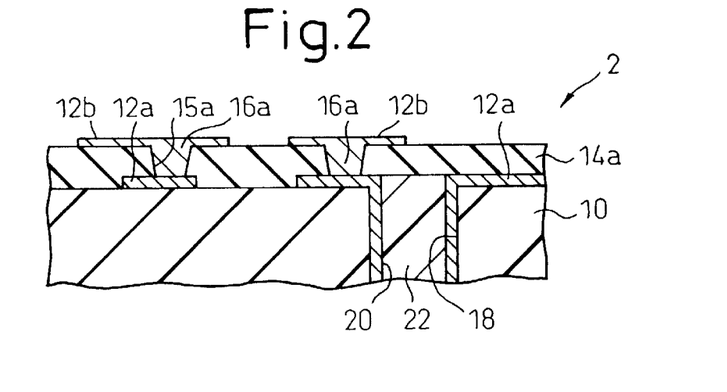
FIG. 2 illustrates another embodiment of the invention.

A multilayer circuit board 2 shown in FIG. 2, which depicts only one side of the multilayer circuit board for simplicity, is manufactured as follows. Through holes 18 are first formed in a core substrate 10. The inside walls of the through holes 18 and both sides of the core substrate 10 are then plated to thereby form thereon a continuous conductor layer. The through hole 18 provided on its inside wall with a conducting member 20, which represents part of the conductor layer deposited on the inside wall of the through hole 18, is filled with a resin material 22. Subsequently, the continuous conductor layer on the surface of the substrate 10 is etched to provide a first layer of patterned wiring lines 12a. An insulation layer 14a is then formed to cover the surface of the substrate 10 provided with the patterned wiring lines 12a. Via holes 15a are formed in the insulation layer 14a to expose parts of the underlying wiring lines 12a at the bottom, and are then filled with a plated material to form a filled via 16a. During the plating step for the formation of the vias 16a, a continuous conductor layer is also formed so as to cover the insulation layer 14a. The continuous conductor layer may be formed separately from the filling of the vias 16a, as earlier described. The continuous conductor layer is then patterned by etching to provide a second layer of wiring lines 12b. Also in this embodiment, the formation of the conductor layer for the conducting member 20 on the inside wall of the through holes 18 and the formation of the vias 16a are carried out in separate steps, so that the continuous conducting member 20 having a necessary thickness can be formed in the through hole 18, and the via 16a can be formed as a filled via.

The formation of the wiring lines 12b can be followed by the formation of one or more layers of wiring lines, which involves the formation of insulation layer or layers and the formation of vias in the insulation layer or layers, as earlier described referring to FIG. 1I, to provide a multilayer circuit board having a further layer or layers of wiring lines, as required.

Figure 3:
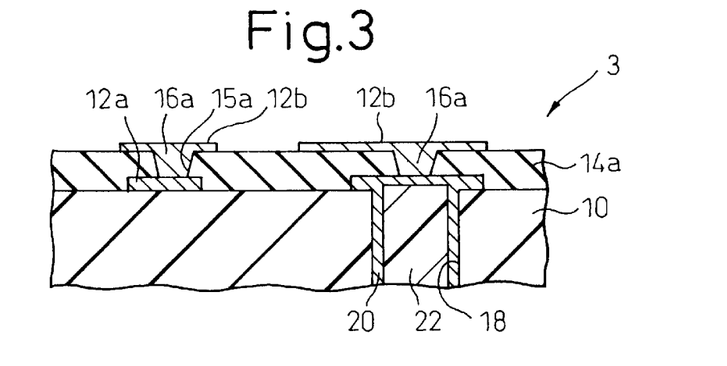
FIG. 3 illustrates a variant of the embodiment in FIG. 2.

A multilayer circuit board 3 shown in FIG. 3, which also depicts only one side of the multilayer circuit board for simplicity, is manufactured as follows. Through holes 18 are first formed in a core substrate 10. The inside walls of the through holes 18 and both sides of the core substrate 10 are then plated to thereby form thereon a continuous conductor layer. The through hole 18 provided on its inside wall with the conductor layer is filled with a resin material 22. Subsequently, a further continuous conductor layer is formed to cover the previously formed continuous conductor layer on the core substrate 10 and the end of the resin material 22 filled in the through holes 18. The set of the continuous conductor layers thus formed in separate steps are then etched together to form a first layer of wiring lines 12a. Although the first layer of wiring lines 12a actually comprises the two conductor layers (more precisely, semi-layers in this context) separately formed, it is indicated as a single layer in the drawing, for simplicity. Subsequently, an insulation layer 14a is formed to cover the surface of the substrate 10 provided with the patterned wiring lines 12a. Via holes 15a are then formed in the insulation layer 14a to expose part of the underlying wiring line 12a at the bottom, and are filled with a plated material to form a filled via 16a. For the formation of the vias 16a in this embodiment, plating conditions are selected so as to be suitable for filling the via holes 15a with the plated material. During the plating step for the formation of the vias 16a, a continuous conductor layer is also formed to cover the insulation layer 14a. The continuous conductor layer may be formed separately from the filling of the vias 16a, as earlier described. The continuous conductor layer is then patterned by etching to provide a second layer of wiring lines 12b, which is connected with the first layer of wiring lines 12a through the filled vias 16a. The multilayer circuit board of this embodiment is characterized in that the via 16a can be located just above the end of the through hole 18 filled with the resin material 22, as shown in FIG. 3.

As in the former embodiments, the formation of the wiring lines 12b can be followed by the formation of one or more layers of wiring lines to provide a multilayer circuit board having a necessary number of layers of wiring lines.

Figure 4:
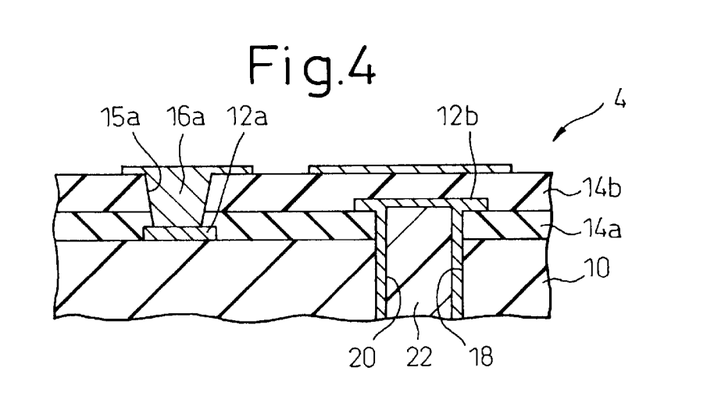
FIG. 4 illustrates a further embodiment of the invention.

A multilayer circuit board 4 illustrated in FIG. 4, which also depicts only one side of the multilayer circuit board for simplicity, is manufactured by forming successive insulation layers on a core substrate 10, and then forming through holes in the insulation layers, as described below in more detail. A first layer of wiring lines 12a is first formed on the core substrate 10. The core substrate 10 provided with the first layer of wiring lines 12a is then covered with an insulation layer (first insulation layer) 14a. Subsequently, through holes 18 are formed so as to go through the insulation layers 14a on respective sides of the substrate 10 and the substrate 10 itself. The inside walls of the through holes 18 and the insulation layers 14a on both sides of the substrate 10 are then plated to form thereon a continuous conductor layer. The through hole 18, provided on its inside wall with the conductor layer, is filled with a resin material 22. The continuous conductor layer is then patterned by etching to form a second layer of wiring lines 12b. The second layer of wiring lines may be formed by forming an additional conductor layer to cover the formerly formed conductor layer, which is on the first insulation layer 14a, and the ends of the insulation material filled in the through holes to provide a lamination of two conductor layers, and patterning the lamination of two conductor layers. The second layer of wiring lines 12b depicted in FIG. 4 represents one formed using such a lamination of two conductor layers, which is characterized in that the end of the resin filled in the through hole 18 is capped by the conductor of the additional conductor layer.

In this embodiment, the first layer of wiring lines 12a is connected with a third layer of wiring layers to be formed after this. To this end, a second insulation layer 14b is formed on the first insulation layer 14a after the formation of the second layer of wiring lines 12b, and via holes 15a are then formed so as to go through the first and second insulation layers 14a, 14b to thereby expose part of the underlying first layer of wiring line 12a. The via holes 15a going through the two insulation layers 14a, 14b can easily be formed by irradiation with a laser beam as earlier described. Subsequently, the via holes 15a are filled with a plated conductor material to form filled vias 16a, while forming a continuous conductor layer of the plated conductor material on the second insulation layer 14b. The continuous conductor layer may be formed separately from the filling of the vias 16a, as earlier described. The continuous conductor layer thus formed is then patterned by etching to provided a third layer of wiring lines 12c, which is connected with the first layer of wiring lines 12a through the filled vias 16a.

As in the former embodiments, one or more layers of wiring lines can be further formed to produce a multilayer circuit board having a necessary number of layers of wiring lines.

Figure 5:
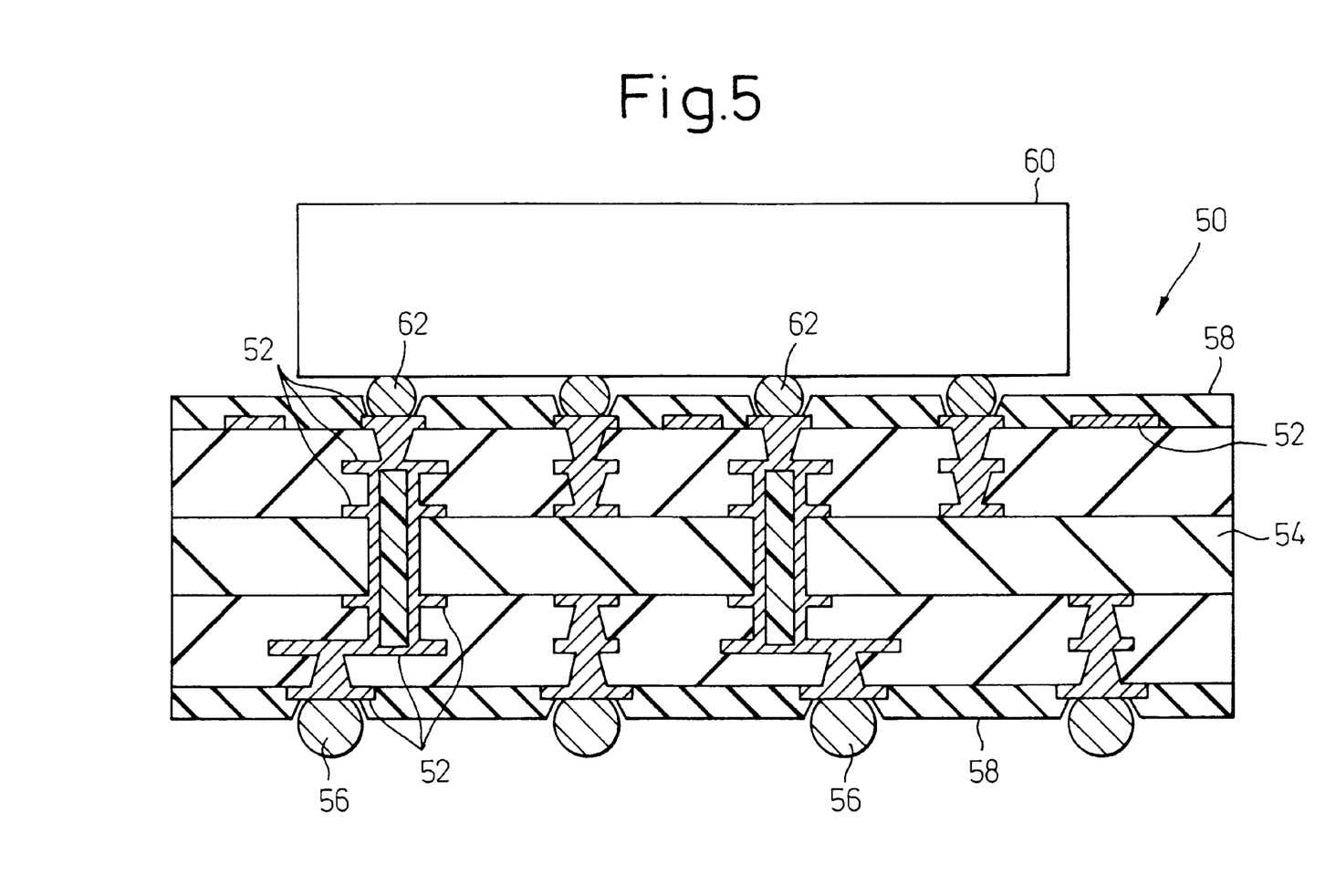
FIG. 5 illustrates a multilayer circuit board manufactured according to the invention, which is used to mount a semiconductor chip thereon.

The multilayer circuit board produced according to the invention can be used to mount, on a component such as a printed circuit board, an electronic part such as a semiconductor chip or device having electrodes or terminals arranged in the form of an area array, for example. FIG. 5 schematically illustrates a multilayer circuit board 50 according to the invention on which a semiconductor chip 60 is mounted through its electrodes 62 formed of a solder ball. The multilayer circuit board 50 has a plurality layers of wiring lines 52 formed on both sides of a core substrate 54, and is provided with external connection terminals 56 formed of a solder ball on the side (the lower side) opposed to the upper side on which the chip 60 is mounted, through which the multilayer circuit board 50 is mounted on a printed circuit board (not shown). In the drawing, the multilayer circuit board is provided with a protective coating 58 on both surfaces thereof.

As described, according to the invention, the plating of the through holes 18 and the plating of the via holes 15a in the first insulation layer 14a (the first and second insulation layers 14a and 14b in the embodiment illustrated in FIG. 4) are carried out separately from each other. Accordingly, a plating solution and plating conditions, which are suitable exclusively for the plating of the through hole 18, can be selected to thereby produce a continuous conductor member 20 having a necessary thickness on the side wall of the through hole 18. Also, a plating solution and plating conditions, which are suitable particularly for the plating of the via hole 15a, can be selected to thereby fill the via hole 15a with a plated conductor material to yield a filled via. The use of the filled vias makes it possible to manufacture a multilayer circuit board in which adjacent layers of wiring lines are connected with each other by the filled vias, and the vias can be arranged at a high density without restriction of their positioning, leading to patterned wiring lines being formed in a high density. Such a multilayer circuit board can advantageously be used to mount a chip or device having an increased number of electrodes or terminals.

This document has described some specific embodiments with reference to the drawings, but the invention is not limited to those embodiments. A person with ordinary skill in the art could make changes or modifications without departing from the scope and spirit of the invention which is fully delineated in the following claims. For example, in some cases, the multilayer circuit board containing partially filled vias in an insulation layer or layers on each side thereof may be produced according to the invention, as required.

What is claimed is:

1. A method of producing a multilayer circuit board which comprises a core substrate and a plurality of layers of wiring lines on both sides of the core substrate, the layers of wiring lines being on each side of the substrate with an insulation layer being interposed therebetween, the layers of wiring lines on both sides being interconnected by conducting members provided on the inside walls of through holes going through the core substrate, and the layers of wiring lines on each side of the core substrate being connected with each other by vias of a conductor material going through the interposed insulation layer, the method comprising, on each of sides of the core substrate, alternately forming a layer of wiring lines and an insulation layer while connecting an lower layer of wiring lines with an upper layer of wiring lines by vias, wherein the conducting member on the inside wall of the through hole and the via are formed in separate steps.

2. The method of claim 1, which comprises the following steps:
   providing a core substrate having a patterned first layer of wiring lines formed on each side thereof,
   forming an insulation layer on each side of the core substrate to cover the entire area of the substrate provided with the first layer of wiring lines,
   forming through holes extending from one side to the other side of the core substrate piercing through the insulation layer on both sides of the core substrate and the core substrate itself,
   forming via holes in the insulation layer on each side of the core substrate to expose parts of the layer of wiring lines at the bottom,
   forming a continuous conductor layer to cover the inside walls of the through holes, the insulation layer, and the exposed parts of the layer of wiring lines,
   filling the through holes with an insulation material,
   filling the via holes with a conductor material,
   forming a conductor layer on the continuous conductor layer covering the insulation layer to provide a lamination of two conductor layers, simultaneously with or separately from the step of filling the via holes, and
   patterning the lamination of two conductor layers to thereby provide a second layer of wiring lines.

3. The method of claim 2, wherein the step of forming through holes is carried out prior to the step of forming via holes.

4. The method of claim 2, wherein the step of forming via holes is carried out prior to the step of forming through holes.

5. The method of claim 2, wherein the continuous conductor layer is formed by electroless plating or sputtering and subsequent electroplating.

6. The method of claim 2, wherein the step of filling the via holes is carried out by electroless plating or sputtering and subsequent electroplating.

7. The method of claim 1, which comprises the following steps:
   providing a core substrate, forming through holes in the core substrate,
   forming a continuous conductor layer on each side of the substrate and the inside walls of the through holes,
   filling the through holes with an insulation material,
   patterning the continuous conductor layer to form a first layer of wiring lines,
   forming an insulation layer on each side of the core substrate to cover the entire area of the substrate provided with the first layer of wiring lines,
   forming via holes in the insulation layer on each side of the core substrate to expose parts of the first layer of wiring lines at the bottom,
   filling the via holes with a conductor material,
   forming a conductor layer on the insulation layer, simultaneously with or separately from the step of filling the via holes, and
   patterning the conductor layer to thereby provide a second layer of wiring lines.

8. The method of claim 7, wherein, prior to the step of patterning the continuous conductor layer, an additional conductor layer is formed on the continuous conductor layer to provide a lamination of two conductor layers on the insulation layer, and the lamination of two conductor layers is then patterned to thereby form the first layer of wiring lines.

9. The method of claim 7, wherein the continuous conductor layer is formed by electroless plating or sputtering and subsequent electroplating.

10. The method of claim 7, wherein the step of filling the via holes is carried out by electroless plating or sputtering and subsequent electroplating.

11. The method of claim 1, which comprises the following steps:
    providing a core substrate having a first layer of patterned wiring lines formed on each side thereof,
    forming an insulation layer on each side of the core substrate to cover the entire area of the substrate provided with the first layer of wiring lines,
    forming through holes extending from one side to the other side of the core substrate through the insulation layer on both sides of the core substrate and the core substrate itself,
    forming a continuous conductor layer to cover the inside walls of the through holes and the insulation layer,
    filling the through holes with an insulation material,
    patterning the continuous conductor layer to provide a second layer of wiring lines,
    forming an additional insulation layer to cover the formerly formed insulation layer provided thereon with the second layer of wiring lines,
    forming via holes through the two insulation layers to expose parts of the first layer of wiring lines at the bottom,
    filling the via holes with a conductor material, forming a conductor layer on the top of the two insulation layers, simultaneously with or separately from the step of filling the via holes, and
    patterning the conductor layer to thereby provide a second layer of wiring lines.

12. The method of claim 11, wherein, prior to the step of patterning the conductor layer to provide a second layer of wiring lines, an additional conductor layer is formed on the continuous conductor layer and the ends of the insulation material filled in the through holes to provide a lamination of two conductor layers, and the lamination of two conductor layers is then patterned to thereby form the second layer of wiring lines.

13. The method of claim 11, wherein the continuous conductor layer is formed by electroless plating or sputtering and subsequent electroplating.

14. The method of claim 11, wherein the step of filling the via holes is carried out by electroless plating or sputtering and subsequent electroplating.

* * * * *